(12) United States Patent
Bandyopadhyay et al.

(10) Patent No.: US 9,319,004 B2
(45) Date of Patent: Apr. 19, 2016

(54) APPARATUS AND METHODS FOR EQUALIZATION

(71) Applicant: ANALOG DEVICES, INC., Norwood, MA (US)

(72) Inventors: Abhishek Bandyopadhyay, Burlington, MA (US); David Paul Foley, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 514 days.

(21) Appl. No.: 13/684,904

(22) Filed: Nov. 26, 2012

(65) Prior Publication Data

US 2014/0145785 A1 May 29, 2014

(51) Int. Cl.
*H03F 1/34* (2006.01)
*H03F 3/45* (2006.01)

(52) U.S. Cl.
CPC .............. *H03F 1/34* (2013.01); *H03F 3/45475* (2013.01); *H03F 2203/45134* (2013.01); *H03F 2203/45138* (2013.01); *H03F 2203/45522* (2013.01); *H03F 2203/45526* (2013.01)

(58) Field of Classification Search
CPC ........ H03F 1/34; H03F 1/342; H03F 3/45475
USPC ....................................................... 333/28 R
See application file for complete search history.

(56) References Cited

U.S. PATENT DOCUMENTS

| | | | |
|---|---|---|---|
| 5,488,635 A | 1/1996 | Chennakeshu et al. | |
| 5,717,773 A | 2/1998 | Maag et al. | |
| 5,990,737 A * | 11/1999 | Czarnul et al. | 330/69 |
| 6,160,452 A | 12/2000 | Daughtry et al. | |
| 6,492,876 B1 | 12/2002 | Kamal et al. | |
| 8,160,237 B2 | 4/2012 | Larzabal et al. | |
| 8,558,955 B2 * | 10/2013 | Ritter et al. | 348/607 |
| 2009/0041106 A1 | 2/2009 | Perez et al. | |
| 2010/0310011 A1 * | 12/2010 | Sexton et al. | 375/316 |
| 2012/0121004 A1 * | 5/2012 | Chang | 375/232 |
| 2013/0241522 A1 * | 9/2013 | Youssefi | 323/313 |

OTHER PUBLICATIONS

PCT International Search Report and Written Opinion dated Feb. 18, 2014, for International Application No. PCT/US2013/068656 filed Nov. 6, 2013. 11 pages.
International Preliminary Report on Patentability and Written Opinion dated Jun. 4, 2015, for International Application No. PCT/US2013/068656 filed Nov. 6, 2013, 6 pages.

* cited by examiner

*Primary Examiner* — Stephen E Jones
*Assistant Examiner* — Scott S Outten
(74) *Attorney, Agent, or Firm* — Knobbe, Martens, Olson & Bear, LLP

(57) ABSTRACT

Apparatus and methods for equalization are provided. In certain implementations, an equalizer includes first and second feedback resistors, first and second equalization resistors, an equalization capacitor, and an amplification circuit that includes first to fourth input terminals and first and second output terminals. The amplification circuit can receive a differential input voltage signal between the first and third input terminals, and the first and second equalization resistors and the equalization capacitor are electrically connected in series between the second and fourth input terminals with the equalization capacitor between the first and second equalization resistors. Additionally, the first feedback resistor is electrically connected between the first output terminal and the second input terminal, and the second feedback resistor is electrically connected between the second output terminal and the fourth input terminal.

19 Claims, 5 Drawing Sheets

US 9,319,004 B2

APPARATUS AND METHODS FOR EQUALIZATION

BACKGROUND

1. Field

Embodiments of the invention relate to electronic devices, and more particularly, to equalizers.

2. Description of the Related Technology

Certain electronic systems can transmit and receive signals using a transmitter and a receiver. In certain instances, the receiver can include an equalizer for compensating for signal loss associated with certain frequency components of a receive signal. For example, the equalizer can boost frequency components of the signal that are attenuated relative to other frequency components of the signal, thereby improving signal fidelity.

There is a need for improved equalizers, including, for example, equalizers having smaller area and/or reduced power consumption.

SUMMARY

In one embodiment, an equalizer, includes an amplification circuit, a first feedback resistor, a second feedback resistor, a first equalization resistor, a second equalization resistor, and an equalization capacitor. The amplification circuit includes a first input terminal, a second input terminal, a third input terminal, a fourth input terminal, a first output terminal, and a second output terminal. The amplification circuit is configured to receive a differential input signal between the first and third input terminals and to generate a differential output signal between the first and second output terminals. Additionally, the amplification circuit is configured to control a voltage of the first output terminal based on a voltage difference between the first and second input terminals, and to control a voltage of the second output terminal based on a voltage difference between the third and fourth input terminals. The first feedback resistor is electrically connected between the first output terminal and the second input terminal of the amplification circuit. The second feedback resistor is electrically connected between the second output terminal and the fourth input terminal of the amplification circuit. The first equalization resistor, the first equalization capacitor, and the second equalization resistor are electrically connected in series between the second and fourth input terminals of the amplification circuit.

In another embodiment, an equalizer includes a means for amplifying, a first feedback resistor, a second feedback resistor, a first equalization resistor, a second equalization resistor, and an equalization capacitor. The amplifying means includes a first input terminal, a second input terminal, a third input terminal, a fourth input terminal, a first output terminal, and a second output terminal. The amplification means is configured to receive a differential input signal between the first and third input terminals and to generate a differential output signal between the first and second output terminals. Additionally, the amplification means is configured to control a voltage of the first output terminal based on a voltage difference between the first and second input terminals, and to control a voltage of the second output terminal based on a voltage difference between the third and fourth input terminals. The first feedback resistor is electrically connected between the first output terminal and the second input terminal of the amplification means. The second feedback resistor is electrically connected between the second output terminal and the fourth input terminal of the amplification means. Additionally, the first equalization resistor, the equalization capacitor, and the second equalization resistor are electrically connected in series between the second and fourth input terminals of the amplification means.

In another embodiment, an apparatus includes a first equalizer, a gain circuit, and a second equalizer. The first equalizer is configured to receive an input signal and to generate an equalized signal. Additionally, the gain circuit is configured to amplify the equalized signal to generate an amplified signal. Furthermore, the second equalizer is configured to equalize the amplified signal to generate an output signal.

DETAILED DESCRIPTION OF EMBODIMENTS

Figure 1:
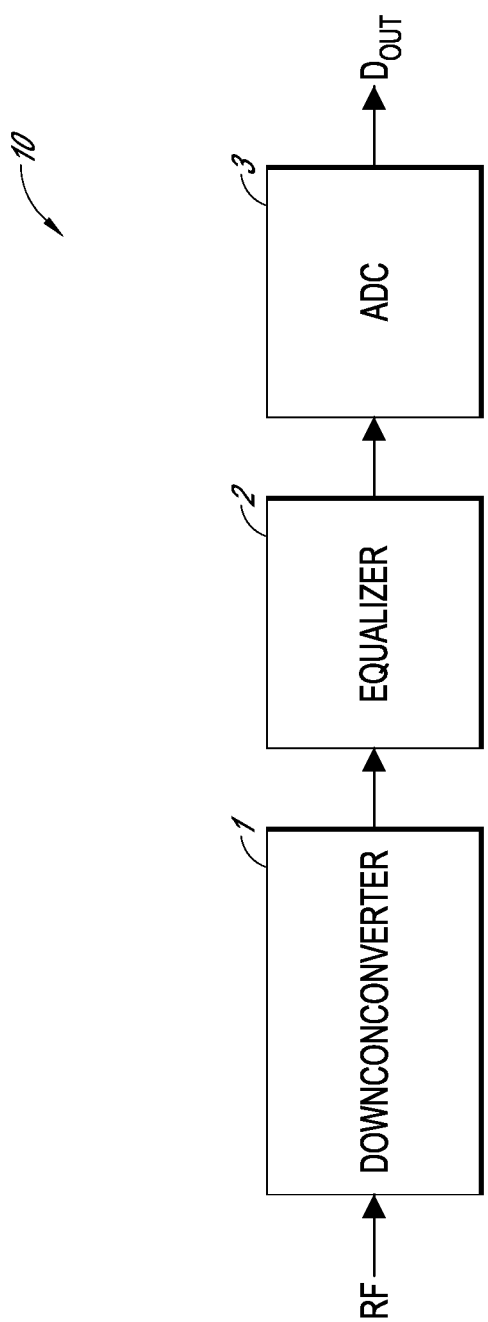
FIG. 1 is a schematic block diagram of one example of an electronic system including an equalizer.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of One Example of an Electronic System Including an Equalizer

One example of an electronic system that can include an equalizer is a radar system, which can be included in an automobile or other vehicle to detect objects in the vicinity of the vehicle. The radar system can transmit a radio frequency (RF) transmit signal into a transmission medium such as air. The transmit signal can be reflected back in all or part by an object in the transmission medium, and can be received by the radar system as a receive signal. The receive signal can include a distance related frequency component and a velocity or Doppler related frequency component.

Radar systems can use various ramp modulation schemes to separate the distance related frequency component from the velocity related frequency component in the reflected receive signal. For example, certain radar systems can use a linear ramp rate where the distance related frequency component can change in proportion to the ramp rate while the velocity related frequency component can be substantially independent of the ramp rate. Additionally, certain other radar systems can use multiple ramp rates to allow for the determination of the distance and velocity related frequency components.

The receive signal's distance related frequency component can be proportional to the object distance. However, the distance related frequency component can be attenuated by a factor that depends on the distance between the vehicle and the object. For example, in certain configurations, the distance related frequency component can be attenuated by a factor that is proportional to the 4th power of the object's distance, which can correspond to an attenuation of about 40 dB/decade in the frequency domain. Accordingly, the radar system can include an equalizer for boosting the receive signal's distance related frequency component by about 40 dB/decade so as to compensate for the dynamic range variation of the receive signal.

A radar system can use external components for equalization. However, external components can have a relatively large amount of variation, which can result in unacceptable channel-to-channel variation when the radar system is implemented in a phase array antenna configuration. Accordingly, a radar system can include an equalizer integrated into the radar system, such as an equalizer integrated on-chip with a receiver or on a separate IC that is encapsulated in a common package with the receiver.

In certain radar configurations, a zero in the equalizer's transfer function can have a relatively low frequency, such as a frequency in the range of about 5 kHz to about 50 kHz. Since the zero's frequency can be inversely proportional to capacitance, a capacitor used to generate the zero can be relatively large. However, using a large capacitor to provide equalization can not only increase the size and area of an IC, but also increase power consumption. The impact of a large capacitor can be exacerbated in integrated equalizer implementations and/or in multi-channel implementations, such as radar systems using phase array antennas.

Provided herein are apparatus and methods for equalization. In certain implementations, an equalizer includes first and second feedback resistors, first and second equalization resistors, an equalization capacitor, and an amplification circuit that includes first to fourth input terminals and first and second output terminals. The amplification circuit can receive a differential input voltage signal between the first and third input terminals and can generate a differential output voltage signal between the first and second output terminals. Additionally, the amplification circuit can control a voltage of the first output terminal based on a voltage difference between the first and second input terminals and can control a voltage of the second output terminal based on a voltage difference between the third and fourth input terminals. The first and second equalization resistors and the equalization capacitor are electrically connected in series between the second and fourth input terminals with the equalization capacitor between the first and second equalization resistors. Additionally, the first feedback resistor is electrically connected between the first output terminal and the second input terminal, and the second feedback resistor is electrically connected between the second output terminal and the fourth input terminal. To provide frequency compensation to the amplification circuit and to maintain equalizer stability, in certain implementations, first and second feedback capacitors are included in parallel with the first and second feedback resistors, respectively.

The equalizer can have less complexity, smaller area, and/or reduced power consumption relative to certain conventional equalizers. For example, the equalizer can control a location in frequency of a zero in the equalizer's transfer function using a single capacitor, which can result in the equalizer having an area and power consumption that can be half or less than that of a conventional equalizer using two or more capacitors for controlling the zero's frequency.

FIG. 1 is a schematic block diagram of one example of an electronic system 10 including an equalizer. The electronic system 10 includes a downconverter 1, an equalizer 2, and an analog-to-digital converter (ADC) 3.

The downconverter 1 includes an input terminal configured to receive a radio frequency (RF) receive signal and an output terminal configured to generate a downconverted signal. The equalizer 2 includes an input terminal configured to receive the downconverted signal and an output terminal configured to generate an equalized signal. The ADC 3 includes an input terminal configured to receive the equalized signal and an output terminal configured to generate a digital output signal $D_{OUT}$, which can be further processed in the electronic system 10.

The electronic system 10 can represent, for example, a portion of a radar system, such as a low speed ramp (LSR) frequency modulated continuous wave (FMCW) radar system. For example, the RF receive signal can correspond to a reflection of a transmit signal generated by the radar system.

The downconverter 1 can be used to downshift or downconvert the frequency content of the RF receive signal to generate a downshifted signal. For example, the downconverter 1 can include a local oscillator and a mixer configured to downshift the frequency content of the RF receive signal by about the local oscillator's frequency. In certain implementations, the downconverter 1 is configured to downshift the RF receive signal to baseband. However, other configurations are possible, such as implementations in which the downconverter 1 downshifts the RF receive signal to an intermediate frequency.

The equalizer 2 can be used to equalize the downshifted signal to generate an equalized signal. For example, in a radar configuration, the downshifted signal can include a distance related frequency component and a velocity related frequency component. Since the distance related frequency component can be attenuated by a factor that depends on an object distance, the equalizer 2 can be used to boost the distance related frequency component by a frequency dependent gain.

The ADC 3 can be configured to convert the equalized signal generated by the equalizer 2 into to the digital output signal $D_{OUT}$. The ADC 3 can be implemented in a wide variety of ways, such as a flash ADC or a sigma-delta ADC, and can have any suitable resolution. The digital output signal $D_{OUT}$ can be further processed in the electronic system 10, such as by a processing module configured to determine one or more frequency tones of the digital output signal $D_{OUT}$ using, for example, a fast Fourier transform (FFT).

The electronic system 10 can include other components, inputs and/or outputs. However, these have been omitted for clarity. Although the equalizer 2 has been illustrated in the context of the electronic system 10, equalizers described herein can be used in a wide array of ICs and other electronics having need for signal equalization.

Overview of Equalizers

Figure 2:
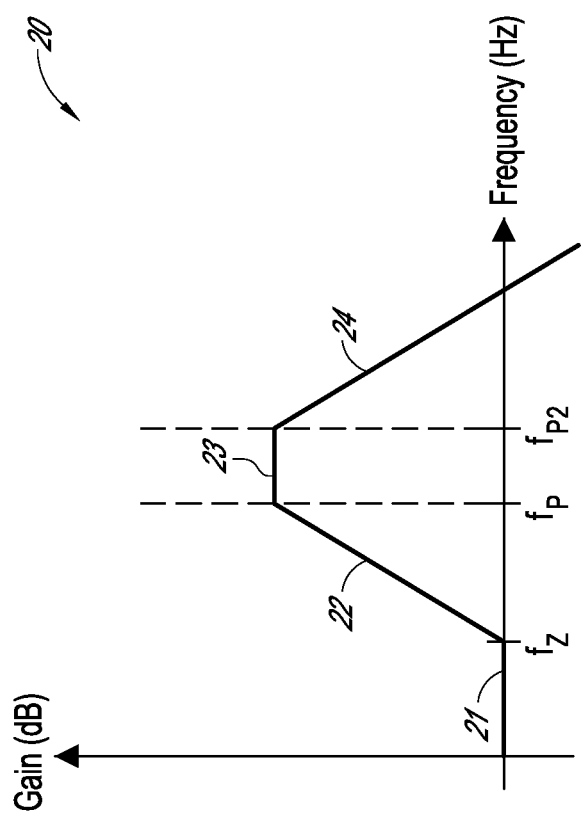
FIG. 2 is a graph of one example of gain versus frequency for an equalizer.

FIG. 2 is a graph 20 of one example of gain versus frequency for an equalizer, such as the equalizer 2 of FIG. 1.

The graph 20 includes a first gain region 21, which can correspond to an equalizer gain between DC and a first zero frequency $f_Z$. In certain implementations, the first gain region 21 can have a relatively low gain, such as a gain of about 0 dB. Configuring the equalizer to have a relatively low gain in the first gain region 21 can prevent the equalizer from boosting low frequency components of a receive signal, which can correspond to frequency information related to objects at very close distances to a vehicle. Although FIG. 2 illustrates the equalizer having a DC gain of about 0 dB, the equalizer can have other DC gain values, such as a DC gain in the range of about 0 dB to about 60 dB.

The graph 20 further includes a second gain region 22, which can correspond to the equalizer's gain between the first zero frequency $f_Z$ and a first pole frequency $f_P$. The second gain region 22 can be used to provide a frequency dependent gain for frequency components between the first zero frequency $f_Z$ and the first pole frequency $f_P$. For example, in certain implementations, the second gain region 22 is configured to provide a gain of about 40 dB/decade. Configuring the equalizer in this manner can aid in equalizing a receive signal in a radar application, which can have a distance related frequency component that can be attenuated by a factor that is proportional to the 4th power of the object's distance. Although in certain configurations the second gain region 22 can be configured to provide a gain of about 40 dB/decade, the equalizer can be configured to provide other gain values, such as a gain value desirable to compensate for attenuation associated with a particular application or system the equalizer is used in.

In one embodiment, the first zero frequency $f_Z$ has a frequency in the range of about 5 kHz to about 50 kHz, and the first pole frequency $f_P$ has a frequency in the range of about 200 kHz to about 300 kHz. However, other configurations are possible, such as configurations depending on system-level constraints.

The graph 20 further includes a third gain region 23 between the first pole frequency $f_P$ and a second pole frequency $f_{P2}$, and a fourth gain region 24 for frequencies greater than the second pole frequency $f_{P2}$. The equalizer's poles can be used to provide gain roll-off at high frequencies, which can aid in enhancing the stability of a system including the equalizer. For example, providing high frequency roll-off can help stabilize an analog-to-digital converter (ADC), such as the ADC 3 of FIG. 1, which can exhibit instability such as oscillations when the ADC's input signal includes amplified high frequency components.

The graph 20 illustrates one example of a gain versus frequency plot for the equalizers described herein. However, the equalizers can be configured in other ways. For example, in one embodiment the equalizer includes additional poles that can provide further attenuation at high frequencies.

Figure 3A:
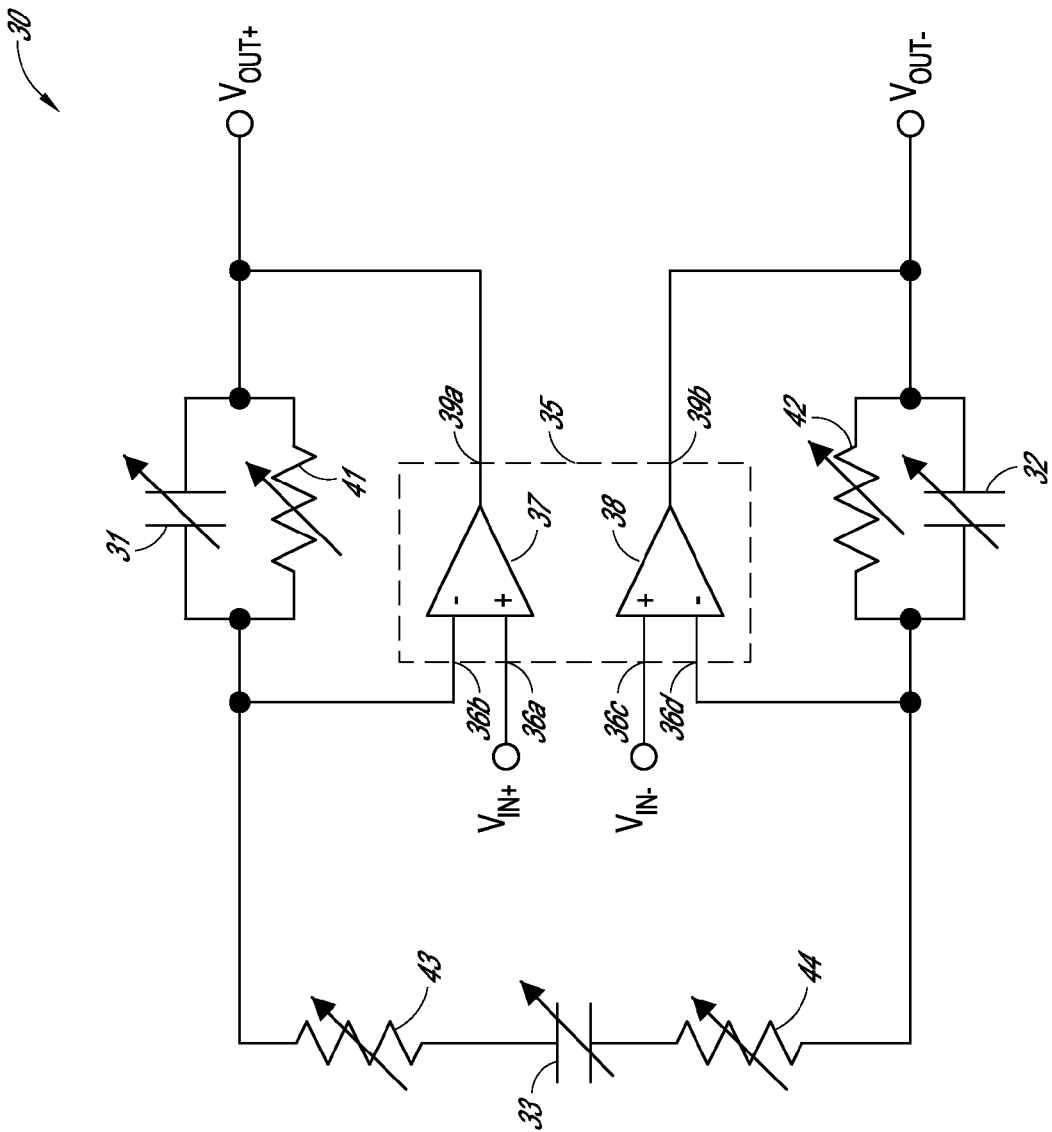
FIG. 3A is a circuit diagram of an equalizer in accordance with one embodiment.

FIG. 3A is a circuit diagram of an equalizer 30 in accordance with one embodiment. The equalizer 30 includes an amplification block or circuit 35, first and second feedback capacitors 31, 32, first and second feedback resistors 41, 42, first and second equalization resistors 43, 44, and an equalization capacitor 33.

The amplification circuit 35 includes first to fourth input terminals 36a-36d, first and second output terminals 39a, 39b, and first and second differential amplifiers 37, 38. The amplification circuit 35 can receive a differential input voltage signal $V_{IN+}$, $V_{IN-}$ between the first and third input terminals 36a, 36c and can generate a differential output voltage signal $V_{IN+}$, $V_{IN-}$ between the first and second output terminals 39a, 39b. In the illustrated configuration, a non-inverting input terminal of the first differential amplifier 37 operates as the first input terminal 36a, an inverting input terminal of the first differential amplifier 37 operates as the second input terminal 36b, and an output terminal of the first differential amplifier 37 operates as the first output terminal 39a. Additionally, a non-inverting input terminal of the second differential amplifier 38 operates as the third input terminal 36c, an inverting input terminal of the second differential amplifier 38 operates as the fourth input terminal 36d, and an output terminal of the second differential amplifier 38 operates as the second output terminal 39b.

The first feedback resistor 41 and the first feedback capacitor 31 are electrically connected in parallel between the second input terminal 36b of the amplification circuit 35 and the first output terminal 39a of the amplification circuit 35. Additionally, the second feedback resistor 42 and the second feedback capacitor 32 are electrically connected in parallel between the fourth input terminal 36d of the amplification circuit 35 and the second output terminal 39b of the amplification circuit 35. Furthermore, the first and second equalization resistors 43, 44 and the equalization capacitor 33 are electrically connected in series between the second and fourth input terminals 36b, 36d of the amplification circuit 35 with the equalization capacitor 33 disposed in an electrical path between the first and second equalization resistors 43, 44.

The equalizer 30 can have a gain versus frequency response similar to that shown in FIG. 2. For example, the equalizer 30 can have a zero frequency $f_Z$ given by Equation 1 below and a first pole frequency $f_P$ given by Equation 2 below, where $R_i$ is the resistance of the first and second equalization resistors 43, 44, $C_i$, is the capacitance of the equalization capacitor 33, $R_f$ is the resistance of the first and second feedback resistors 41, 42, and $\pi$ is the mathematical constant pi.

$$f_z = \frac{1}{4\pi(R_i + R_f)C_i} \quad \text{Equation 1}$$

$$f_p = \frac{1}{4\pi R_i C_i} \quad \text{Equation 2}$$

The frequency response of the equalizer 30 can be controlled by selecting the resistances of the first and second feedback resistors 41, 42, the resistances of the first and second equalization resistors 43, 44, and the capacitance of the equalization capacitor 33. Although Equations 1 and 2 can correspond to the pole and zero locations for a symmetric configuration in which the resistances of the first and second feedback resistors 41, 42 are the same and the resistances of the first and second equalization resistors 43, 44 are the same, the principles and advantages disclosed herein are applicable to asymmetric configurations, including, for example, asymmetric configurations associated with component variation.

In FIG. 3A, the capacitors 31-33 and the resistors 41-44 are illustrated as programmable or variable components. In certain implementations, the programmable capacitors can each include a plurality of capacitor segments that can be selected or deselected, such as by using select signals generated from a digital decoder based on digital configuration data. Additionally, the programmable resistors can be implemented using, for example, a plurality of resistor segments that can be selected or deselected using control signals. Configuring the illustrated resistors and capacitors to be tunable or programmable can provide enhanced control of the equalizer 30, such as enhanced control of the equalizer's pole and zero locations. Although one configuration of programmable capacitors and resistors has been described, other configurations are possible. For example, in certain implementations, the programmable capacitors and/or the programmable resistors can be implemented using active devices such as transistors, and a desired capacitance or resistance can be achieved by tuning an analog bias signal of the active devices. Additionally, in certain implementations, one or more of the programmable resistors and/or programmable capacitors can be omitted in favor of using components of fixed value.

As shown by Equation 1 above, the equalizer 30 can be used to provide a transfer function zero based on the capacitance of the equalization capacitor 33, thereby providing a smaller area relatively to a configuration using two more equalization capacitors to control the location in frequency of the zero. For example, when the equalizer 30 is used in a radar system, the zero's frequency can be relatively low, such as a frequency in the range of about 5 kHz to about 50 kHz. Since the zero's frequency can be inversely proportional to an equalization capacitance, using a single equalization capacitor can provide a significant area reduction relative to a multi-capacitor equalization scheme. For instance, in an implementation using metal-insulator-metal (MIM) and/or metaloxide-metal (MOM) capacitive structures to implement the equalization capacitor, the equalizer 30 can provide a significant reduction in integrated circuit (IC) area. Additionally, as shown by Equation 2 above, the equalizer 30 can also be used to provide a transfer function pole based on the capacitance of the equalization capacitor 33, which can provide an additional reduction in area relative to an equalizer that controls a pole's frequency using multiple capacitors.

The first and second feedback capacitors 31, 32 can aid in controlling the high frequency roll-off of the equalizer 30. Additionally, the first and second feedback capacitors 31, 32 can aid in providing frequency compensation to the first and second differential amplifiers 37, 38, so as to provide closed-loop stability. Although FIG. 3A illustrates a configuration in which the first and second feedback capacitors 31, 32 are included, in certain implementations the first and second feedback capacitors 31, 32 can be omitted or arranged in other ways. In the illustrated configuration, the first and second feedback capacitors 31, 32 have been implemented as programmable components, which can aid in providing enhanced control over frequency compensation. However, in other configurations, the first and second feedback capacitors 31, 32 can have a fixed value.

Although FIG. 3A illustrates a configuration in which the equalization capacitor 33 is disposed between the first and second equalization resistors 43, 44, other configuration are possible. For example, in one embodiment, the series order of the first and second equalization resistors 43, 44 and the equalization capacitor 33 can be changed. However, changing an order of the first and second equalization resistors 43, 44 and the equalization capacitor 33 can cause circuit asymmetry that can increase the total harmonic distortion (THD) of the equalizer 30.

The amplification circuit 35 has been configured to control a voltage of the first output terminal 39a based on a voltage difference between the first and second input terminals 36a, 36b and to control a voltage of the second output terminal 39b based on a voltage difference between the third and fourth input terminals 36c, 36d. Although the amplification circuit 35 illustrates one suitable implementation of an amplification circuit, other configurations of the amplification circuit can be used.

In certain implementations, the first and second differential amplifiers 37, 38 are configured to be low-bandwidth amplifiers, such as amplifiers having a gain bandwidth of less than about 10 MHz. Configuring the first and second differential amplifiers 37, 38 to have a relatively low bandwidth can aid in reducing the amplification circuit's size, cost, and/or power consumption. Additionally, configuring the equalizer in this manner can aid in attenuating high frequency components associated with signal frequencies greater than the first pole frequency $f_P$, thereby enhancing the stability of a block, such as an ADC that receives the equalized signal.

Figure 3B:
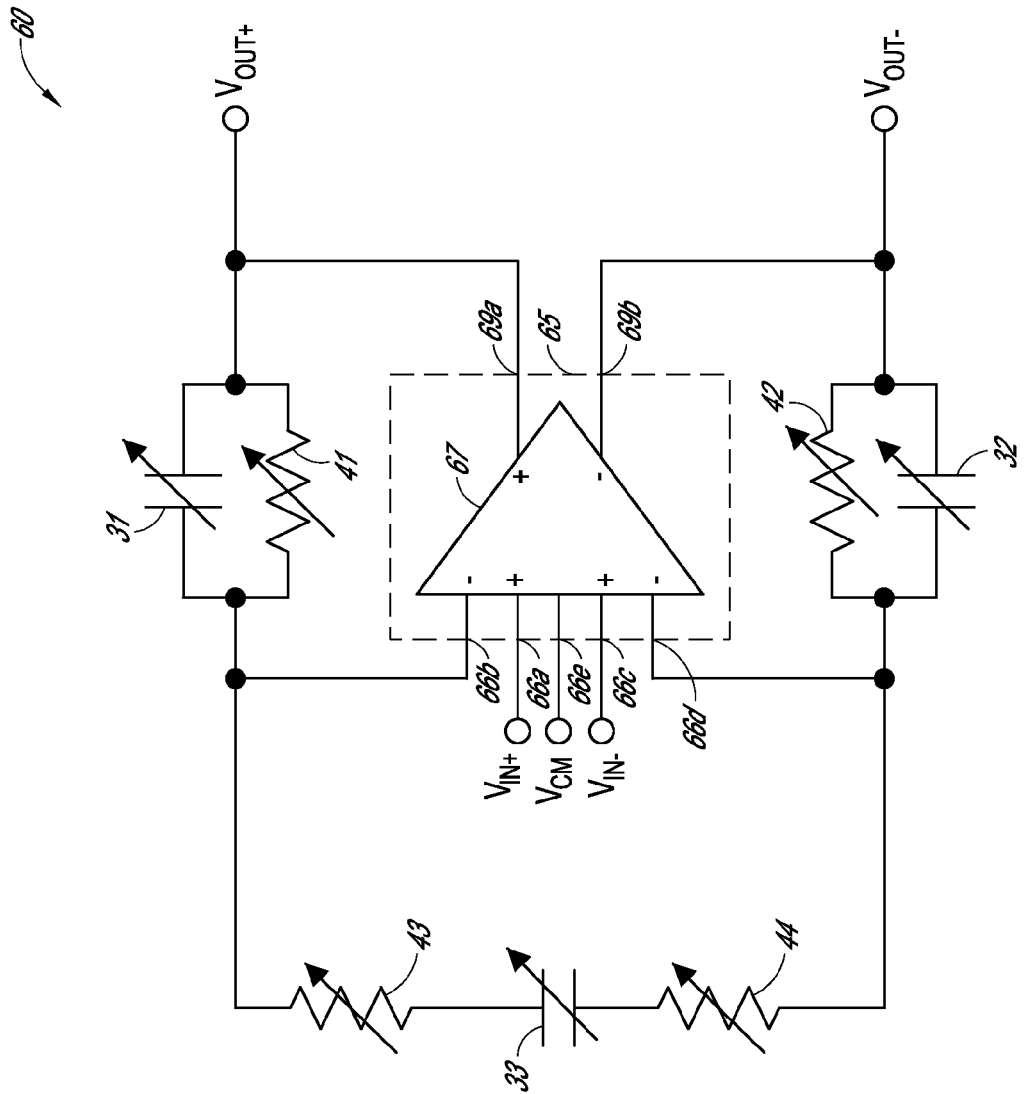
FIG. 3B is a circuit diagram of an equalizer in accordance with another embodiment.

FIG. 3B is a circuit diagram of an equalizer 60 in accordance with another embodiment. The equalizer 60 includes first and second feedback capacitors 31, 32, the equalization capacitor 33, first and second feedback resistors 41, 42, first and second equalization resistors 43, 44, and an amplification circuit 65.

The equalizer 60 of FIG. 3B is similar to the equalizer 30 of FIG. 3A, except that the equalizer 60 includes a different configuration of an amplification circuit. In particular, the amplification circuit 65 of FIG. 3B includes first to fourth input terminals 66a-66d, a common-mode reference voltage terminal 66e, first and second output terminals 69a, 69b, and a multi-input differential amplifier 67. The multi-input differential amplifier 67 includes a first non-inverting input terminal configured to operate as the first input terminal 66a, a first inverting input terminal configured to operate as the second input terminal 66b, a second non-inverting input terminal configured to operate as the third input terminal 66c, a second inverting input terminal configured to operate as the fourth input terminal 66d, a non-inverting output terminal configured to operate as the first output terminal 69a, and an inverting output terminal configured to operate as the second output terminal 69b.

The multi-input differential amplifier 67 can include a first differential transistor pair connected to the first and second input terminals 66a, 66b and a second differential transistor pair connected to the third and fourth input terminals 66c, 66d. The first and second differential transistors pairs can be used to generate first and second differential amplified signals, respectively, which can be combined to generate a differential output signal between the first and second output terminals 69a, 69b. For example, the multi-input differential amplifier 67 can include a folded-cascode stage configured to combine the amplified signals generated by the first and second differential pairs to generate the differential output signal.

The common-mode reference voltage terminal 66e can be used to control the common-mode output voltage of the differential output signal generated between the first and second output terminals 69a, 69b. For example, the common-mode reference voltage terminal 66e can receive a common-mode reference voltage signal, which can be provided to the multi-input differential amplifier 67. Additionally, the multi-input differential amplifier 67 can include feedback circuitry that controls a common-mode output voltage of the first and second output terminals 69a, 69b to be about equal to the common-mode reference voltage signal. In one embodiment, the common-mode reference voltage signal is generated using a band-gap voltage reference circuit.

The amplification circuit 65 of FIG. 3B can have fewer input stage devices relative to the amplification circuit 35 of FIG. 3A. For example, the amplification circuit 65 can include input transistor differential pairs implemented in a common input stage, and thus the amplification circuit 65 can include fewer overall input stage devices relative to a configuration using two independent input stages. Accordingly, the amplification circuit 65 of FIG. 3B can be associated with reduced noise, lower offset, and improved output common-mode rejection ratio (CMRR) relative to the configuration shown in FIG. 3A. However, the amplification circuit 65 of FIG. 3B can also have increased complexity relative to the amplification circuit 35 of FIG. 3A, and thus the amplification circuit 35 of FIG. 3A can be used in certain configurations.

Figure 4:
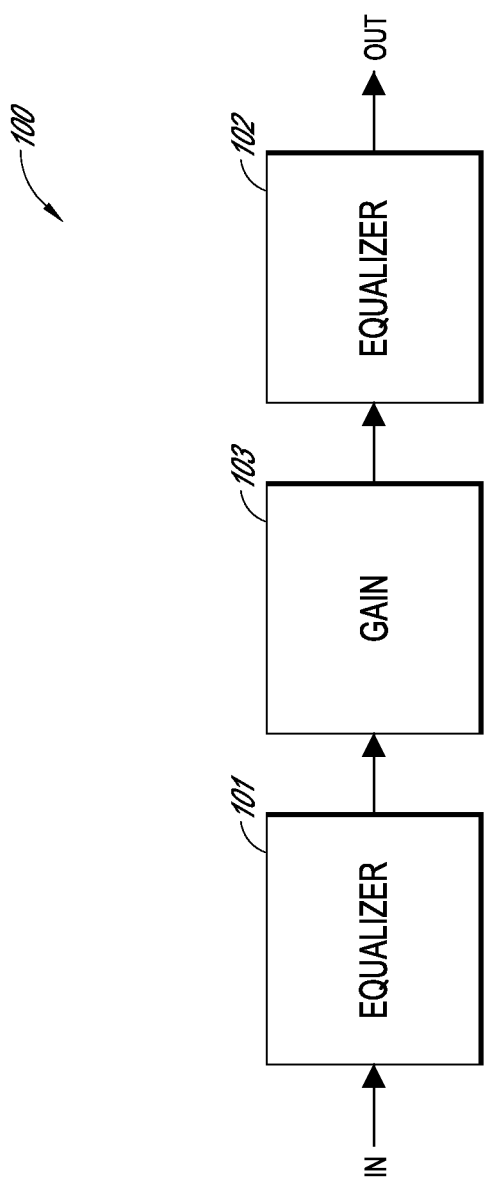
FIG. 4 is a schematic block diagram of an equalization system in accordance with one embodiment.

FIG. 4 is a schematic block diagram of an equalization system 100 in accordance with one embodiment. The equalization system 100 includes a first equalizer 101, a second equalizer 102, and a gain block or circuit 103.

The first equalizer 101 is configured to receive an input signal IN and to generate an equalized signal. The gain block 103 is configured to amplify the equalized signal to generate an amplified signal. The second equalizer 102 is configured to receive the amplified signal and to generate an output signal OUT.

The equalization system 100 illustrates a configuration in which the gain block 103 has been provided between the first and second equalizers 101, 102. Including the gain block 103 can improve the performance of the equalization system 100 by reducing the input referred noise of the second equalizer 102 by about the gain of the gain block 103. Reducing the input referred noise can permit the second equalizer 102 to be implemented using low power techniques. The gain of the gain block 103 can have any suitable value, such as a gain in the range of about 0 dB to about 60 dB.

In one embodiment, the equalization system 100 is used in the electronic system 10 of FIG. 1 as the equalizer 2. In such an embodiment, the input signal IN can be generated by the downconverter 1 of FIG. 1 and the output signal OUT can be provided to the ADC 3 of FIG. 1. However, the equalization system 100 can be used in other configurations and applications.

In certain implementations, the first equalizer 101 is a passive equalizer implemented using passive components and the second equalizer 102 is an active equalizer implemented using active components alone or in combination with passive components. For example, in one embodiment, the first equalizer 101 includes an AC blocking capacitor configured to differentiate the input signal IN and the second equalizer 102 is implemented using the configuration shown in FIG. 3A or the configuration shown in FIG. 3B. In certain implementations, the equalization system 100 can be configured to have a frequency response similar to that shown in FIG. 2. Although the first equalizer 101 can be a passive equalizer and the second equalizer 102 can be an active equalizer, other configurations are possible. For example, in one embodiment, the first and second equalizers 101, 102 are both active equalizers implemented using the configuration shown in FIG. 3A or the configuration shown in FIG. 3B or a combination thereof.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices, such as electronic devices including radar systems. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, an automobile, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
a first equalizer configured to receive an input signal and to generate an equalized signal;
a gain circuit configured to receive the equalized signal from the first equalizer and to amplify the equalized signal to generate a differential input signal; and
a second equalizer, comprising:
means for amplifying including a first input terminal, a second input terminal, a third input terminal, a fourth input terminal, a common-mode reference voltage terminal configured to receive a common-mode reference voltage signal, a first output terminal, and a second output terminal, wherein the amplification means is configured to receive the differential input signal between the first and third input terminals and to generate a differential output signal between the first and second output terminals, wherein the amplification means is configured to control a voltage of the first output terminal based on a voltage difference between the first and second input terminals, wherein the amplification means is further configured to control a voltage of the second output terminal based on a voltage difference between the third and fourth input terminals, wherein the amplification means is further configured to control a common-mode voltage of the differential output signal based on the common-mode reference voltage signal;
a first feedback resistor electrically connected between the first output terminal and the second input terminal of the amplification means;
a second feedback resistor electrically connected between the second output terminal and the fourth input terminal of the amplification means;
a first equalization resistor;
a second equalization resistor; and
an equalization capacitor, wherein the first and second equalization resistors and the equalization capacitor are electrically connected in series between the second and fourth input terminals of the amplification means.

2. The apparatus of claim 1, wherein the equalization capacitor is disposed in an electrical path between the first and second equalization resistors.

3. The apparatus of claim 2, wherein the equalization capacitor is programmable, and wherein the first and second equalization resistors are programmable.

4. The apparatus of claim 3, wherein the first and second feedback resistors are programmable.

5. The apparatus of claim 1, further comprising a first feedback capacitor electrically connected between the first output terminal and the second input terminal of the amplification means and a second feedback capacitor electrically connected between the second output terminal and the fourth input terminal of the amplification means.

6. An apparatus, comprising:
a first equalizer configured to receive an input signal and to generate an equalized signal;
a gain circuit configured to receive the equalized signal from the first equalizer and to amplify the equalized signal to generate a differential input signal; and a second equalizer configured to receive the differential input signal from the gain circuit, the second equalizer comprising:
  an amplification circuit including a first input terminal, a second input terminal, a third input terminal, a fourth input terminal, a common-mode reference voltage terminal configured to receive a common-mode reference voltage signal, a first output terminal, and a second output terminal, wherein the amplification circuit is configured to receive the differential input signal between the first and third input terminals and to generate a differential output signal between the first and second output terminals, wherein the amplification circuit is configured to control a voltage of the first output terminal based on a voltage difference between the first and second input terminals, wherein the amplification circuit is further configured to control a voltage of the second output terminal based on a voltage difference between the third and fourth input terminals, and wherein the amplification circuit is further configured to control a common-mode voltage of the differential output signal based on the common-mode reference voltage signal;
  a first feedback resistor electrically connected between the first output terminal and the second input terminal of the amplification circuit;
  a second feedback resistor electrically connected between the second output terminal and the fourth input terminal of the amplification circuit;
  a first equalization resistor;
  a second equalization resistor; and
  an equalization capacitor, wherein the first and second equalization resistors and the equalization capacitor are electrically connected in series between the second and fourth input terminals of the amplification circuit.

7. The apparatus of claim 6, wherein the equalization capacitor is disposed in an electrical path between the first and second equalization resistors.

8. The apparatus of claim 7, wherein the equalization capacitor is programmable.

9. The apparatus of claim 7, wherein the first and second equalization resistors are programmable.

10. The apparatus of claim 7, wherein the first and second feedback resistors are programmable.

11. The apparatus of claim 6, further comprising:
  a downconverter configured to receive a radio frequency receive signal and to downshift the radio frequency receive signal to generate the differential input signal.

12. The apparatus of claim 11, further comprising:
  an analog-to-digital converter configured to receive the differential output signal and to generate a digital signal.

13. The apparatus of claim 6, wherein the input signal comprises a distance related frequency component and a velocity related frequency component.

14. The apparatus of claim 13, wherein the first and second equalizers are configured to boost the distance related frequency component by a frequency dependent gain.

15. The apparatus of claim 6, wherein the second equalizer further comprises a first feedback capacitor electrically connected between the first output terminal and the second input terminal of the amplification circuit and a second feedback capacitor electrically connected between the second output terminal and the fourth input terminal of the amplification circuit.

16. The apparatus of claim 6, wherein the amplification circuit comprises:
  a first differential amplifier including a non-inverting input terminal configured to operate as the first input terminal of the amplification circuit, an inverting input terminal configured to operate as the second input terminal of the amplification circuit, and an output terminal configured to operate as the first output terminal of the amplification circuit; and
  a second differential amplifier including a non-inverting input terminal configured to operate as the third input terminal of the amplification circuit, an inverting input terminal configured to operate as the fourth input terminal of the amplification circuit, and an output terminal configured to operate as the second output terminal of the amplification circuit.

17. The apparatus of claim 6, wherein the first equalizer is a passive equalizer.

18. The apparatus of claim 6, wherein the amplification circuit comprises feedback circuitry that controls the common-mode output voltage of the differential output signal to be about equal to the common-mode reference voltage signal.

19. The apparatus of claim 6, further comprising a bandgap voltage reference circuit configured to generate the common-mode reference voltage signal.

* * * * *